United States Patent [19]

Bakermans

[11] 4,270,267
[45] Jun. 2, 1981

[54] MACHINE FOR MASS INSERTION OF ELECTRICAL TERMINALS

[75] Inventor: Johannes C. W. Bakermans, Harrisburg, Pa.

[73] Assignee: AMP Incorporated, Harrisburg, Pa.

[21] Appl. No.: 39,933

[22] Filed: May 17, 1979

[51] Int. Cl.³ ............................................ H01R 43/00
[52] U.S. Cl. ........................................ 29/881; 29/739; 29/884; 227/140
[58] Field of Search ................ 29/739, 741, 845, 884, 29/881, 882; 227/140, 135, 136

[56] References Cited

U.S. PATENT DOCUMENTS

| 3,000,416 | 4/1974 | Shultz et al. | 29/884 |
| 3,545,606 | 12/1970 | Bennett et al. | 206/56 |
| 3,807,045 | 4/1974 | Bennett et al. | 29/884 |
| 3,875,636 | 4/1975 | Schultz et al. | 29/741 |

Primary Examiner—Carl E. Hall
Attorney, Agent, or Firm—Russell J. Egan

[57] ABSTRACT

A machine is disclosed for mass insertion of multiple terminals into preformed passageways in housings, printed circuit boards or the like. The terminals each have one end detachably secured to a flexible carrier strip and are transported to the insertion station thereby. The machine grips large groups of the terminal in the insertion station, removes them from the carrier strip, and inserts the terminals into the preformed passageways in a housing, printed circuit board, or the like. The terminals are carried and inserted in two parallel spaced rows, with the alignment therebetween being insured by a shuttle which is placed between the rows of terminals at the insertion station. The group of terminals to be inserted is grasped by jaw members and held against the shuttle during the insertion movement. The jaws then release the terminals and return the shuttle to its original position. The subject machine can be used in a single head or in multiple head embodiments to selectively insert groups of terminals to achieve the desired total number of terminals inserted in any one fixture.

12 Claims, 14 Drawing Figures

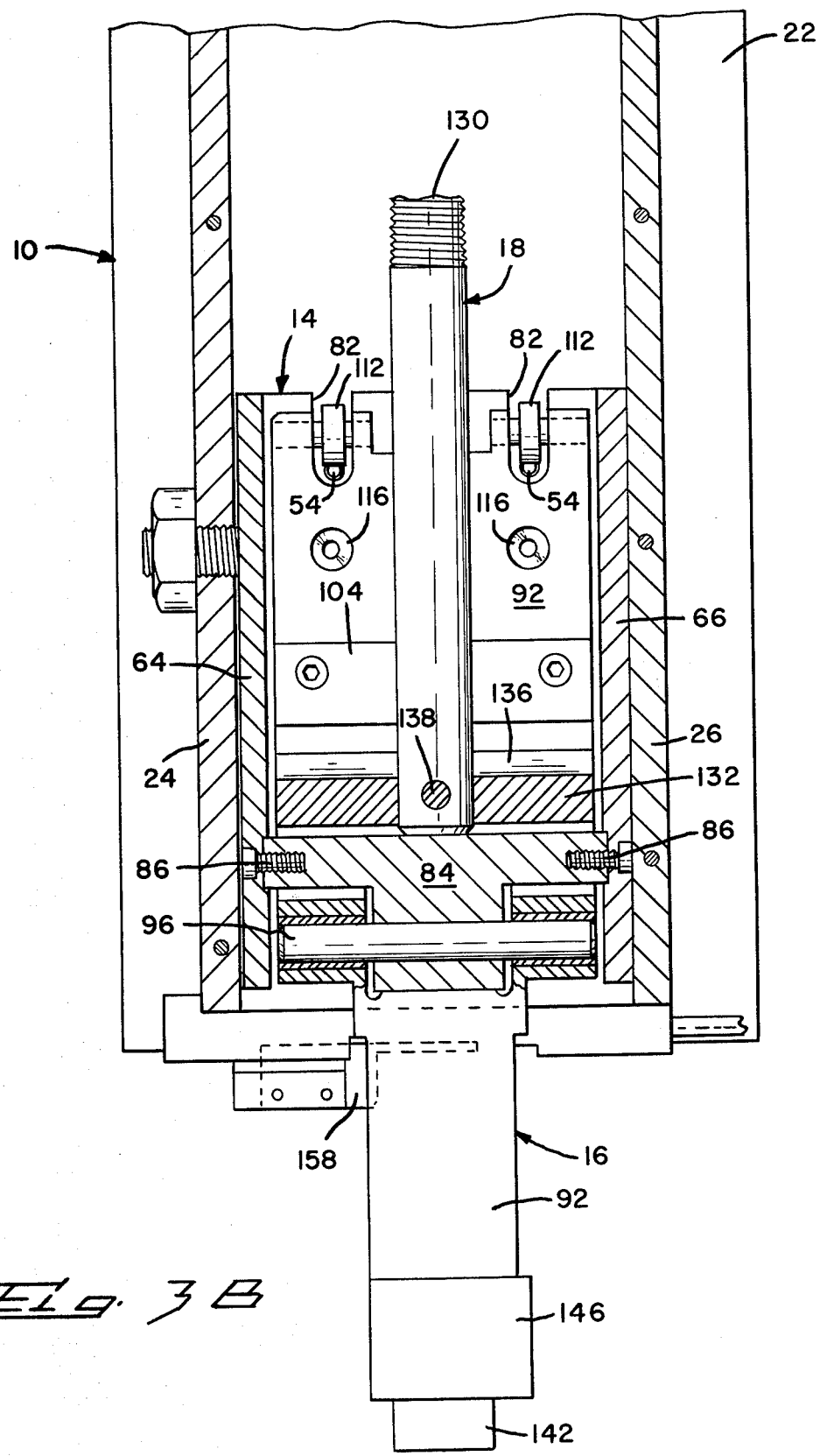

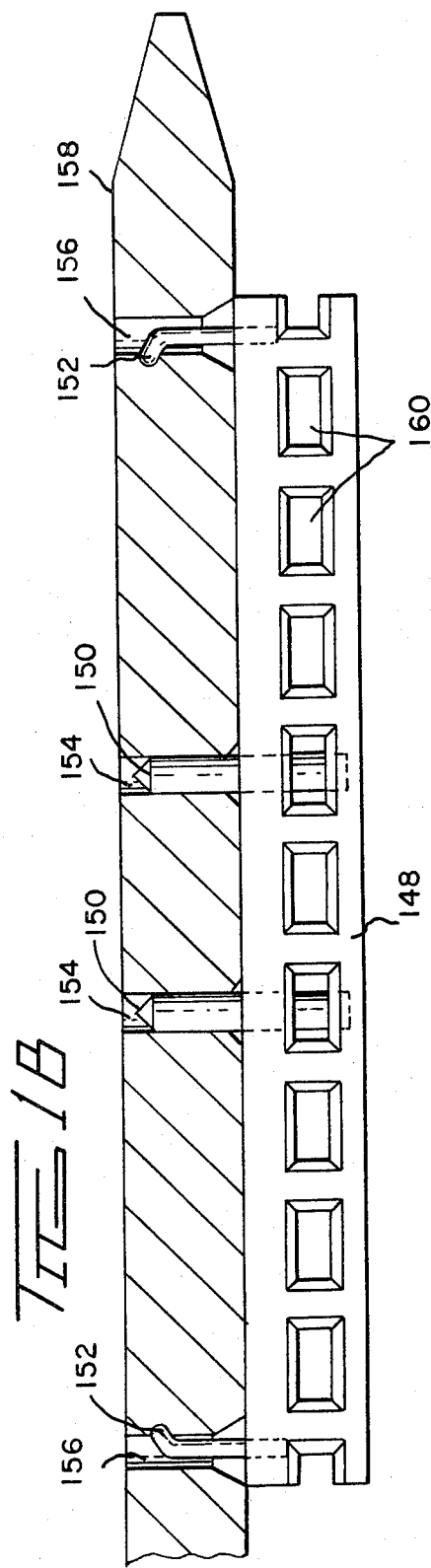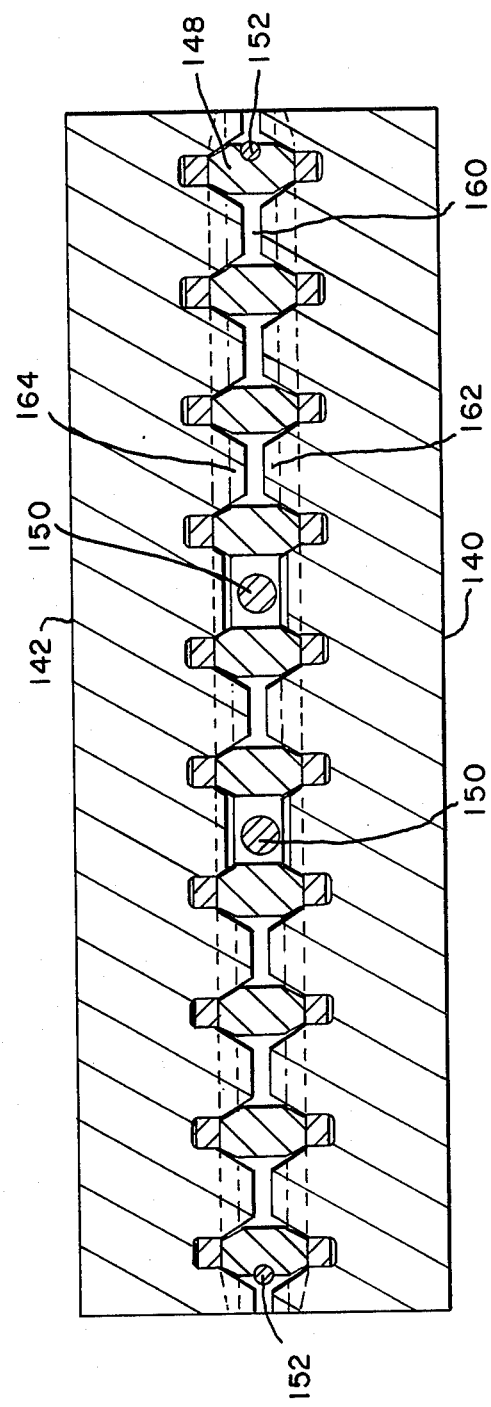

MACHINE FOR MASS INSERTION OF ELECTRICAL TERMINALS

BACKGROUND OF THE INVENTION

1. The Field of the Invention

The present invention relates to a machine for gang inserting electrical terminals and in particular to a machine which strips groups of terminals from a carrier strip and inserts them into preformed passageways with the proper spacing and alignment being constantly maintained.

2. The Prior Art

It is often desired to have a plurality of terminals inserted into an electrical connector housing, printed circuit board, or the like in a closely spaced high density array. Clearly the time involved to individually insert terminals in high density array would be cost prohibitive. It is therefore necessary to both use a carrier means which will accommodate the terminals in a high density array and some machinery for accomplishing the mass insertion of these terminals.

The present machine is intended for use in combination with a flexible tape terminal strip of the type disclosed in U.S. Pat. Nos. 3,545,606 and 3,807,045, the disclosures of which are incorporated herein by reference. These patents basically describe a flexible tape which has a plurality of pin type terminals associated therewith. One end of each of the terminals is inserted in the tape in such manner as to hold it against accidental separation yet allowing sufficient ease of withdrawal from the tape that automated handling is both feasible and desirable.

SUMMARY OF THE INVENTION

The subject insertion machine is intended for use in removing a plurality of like electrical terminals from a flexible carrier tape and simultaneously inserting the terminals into appropriate preformed apertures in a housing or the like. The insertion machine feeds the carrier tape, which carries the terminals in two parallel spaced rows, to a work station wherein a shuttle is received between the rows of terminals. A group of terminals are then grasped by jaws and held against the shuttle for accurate alignment and spacing while they are stripped from the carrier tape and inserted into respective preformed apertures in a housing or the like. After insertion of the terminals, the jaws release their grip on the terminals but maintain adequate gripping to assure withdrawal of the shuttle from between the inserted terminals with minimum scraping of the surfaces of the terminals which would damage any plating thereon. The jaws return the shuttle to a parked position. The next sequential group of terminals can then be moved to a position adjacent the shuttle where they can be grasped for an insertion operation.

It is therefore an object of the present invention to produce an apparatus for mass insertion of individual electrical terminals carried by a flexible tape in two parallel spaced rows.

It is another object of the present invention to produce a machine which will strip a plurality of electrical terminals from a flexible carrier strip, hold the terminals in an accurate spaced alignment, and insert the terminals into respective apertures of a housing or the like.

It is a further object of the present invention to produce a machine for inserting a plurality of electrical terminals into apertures of a housing or the like which machine can be used singly or in combination in order to achieve the desired number of terminals which are inserted into a high density array with the fewest number of insertions required.

It is a still further object of the present invention to produce a machine for mass insertion of electrical terminals which machine can be readily and economically manufactured.

The foregoing objects and other advantages will become apparent to those skilled in the art from the following detailed description taken with reference to the accompanying drawings.

BRIEF DESCRIPTION OF THE DRAWINGS

FIG. 1B is a further detailed view, also partially in section, taken along line 1B—1B of FIG. 1A;

FIG. 2B is a detailed section view taken along line 2B—2B of FIG. 2A;

FIG. 3B is a vertical transverse section taken along line 3B—3B of FIG. 3 and represents a section taken 90° from the section of FIG. 3;

DETAILED DESCRIPTION OF THE PREFERRED EMBODIMENT

Figure 1:
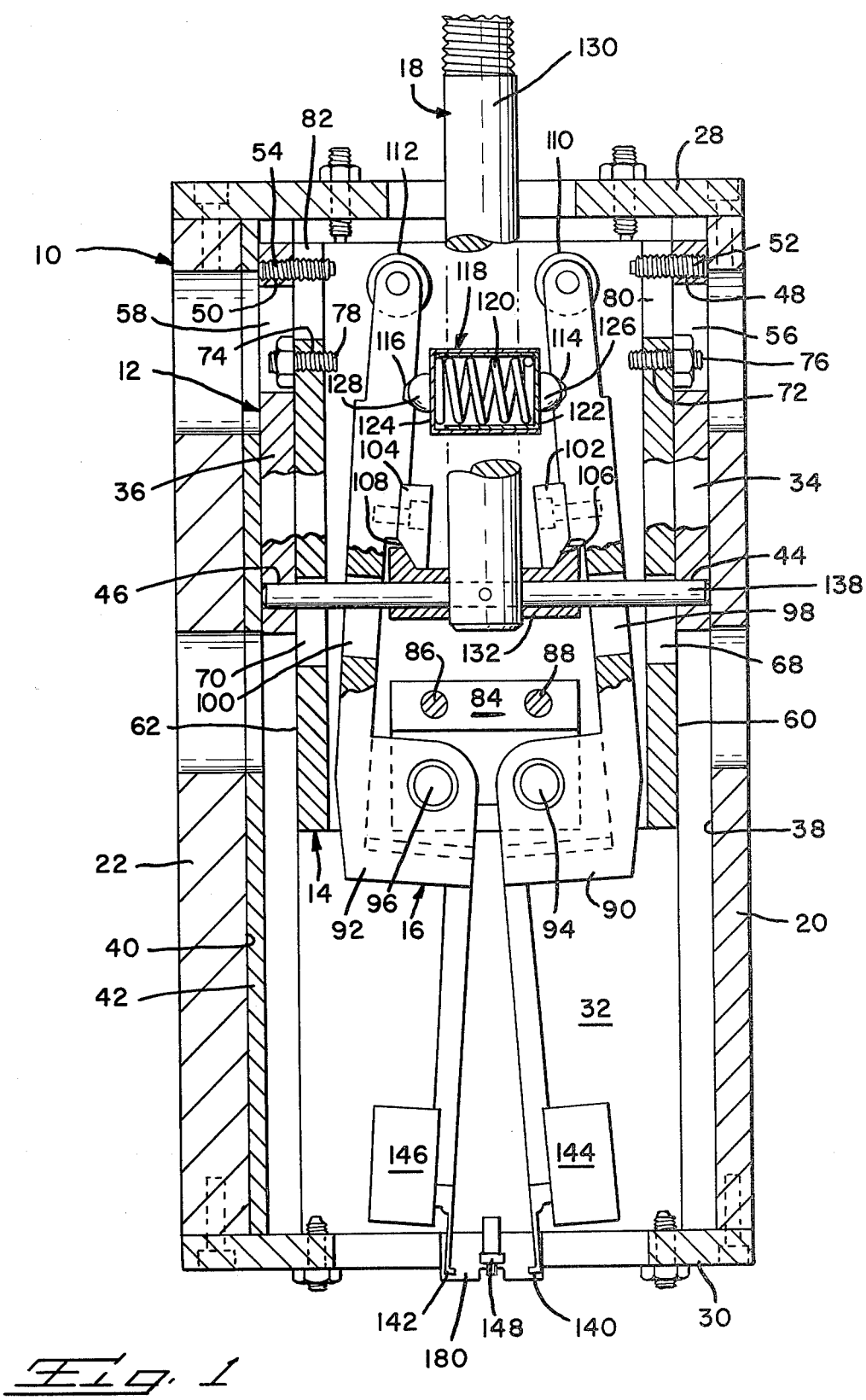
FIG. 1 is a vertical transverse section through the subject machine in a rest condition awaiting feed of a strip of terminals.

The subject insertion machine generally comprises a housing 10 having a slide plate case 12 movably mounted therein with an inter slide box 14 movably positioned within the slide case. A gripping assembly 16 is carried by the slide box 14 and driven by drive means 18. The drive source for the drive means 18 has not been shown nor has any of the actuation mechanism been shown since this is of a standard design and does not form a portion of the present invention.

The housing 10 comprises a front plate 20, a rear plate 22, side plates 24, 26, top plate 28, and bottom plate 30 all rigidly assembled together to form a substantially enclosed rectangular configuration defining a cavity 32 therein. The slide plate case 12 includes a first slide plate 34 and a second slide plate 36, each of which is mounted for vertical movement in a first channel 38 and a second channel 40 in the front plate 20 and rear plate 22, respectively. This can best be appreciated from the horizontal section of FIG. 3C. A single wear plate 42 is shown in the second channel 40 in the rear plate 22 and would be provided as necessary in both the front and rear plates, depending upon the materials used to form the plates. The first and second slide plates 34 and 36 are each provided with a pivot pin hole 44, 46 centrally disposed near their lower ends and guide pin holes 48, 50 near their upper ends. Each guide pin hole 48, 50 is provided with a guide pin 52, 54 fixed therein by known means, such as the threads illustrated. The plates 34, 36 are also provided with elongated slots 56, 58 towards their upper ends adjacent guide pins 52, 54.

Figure 3C:
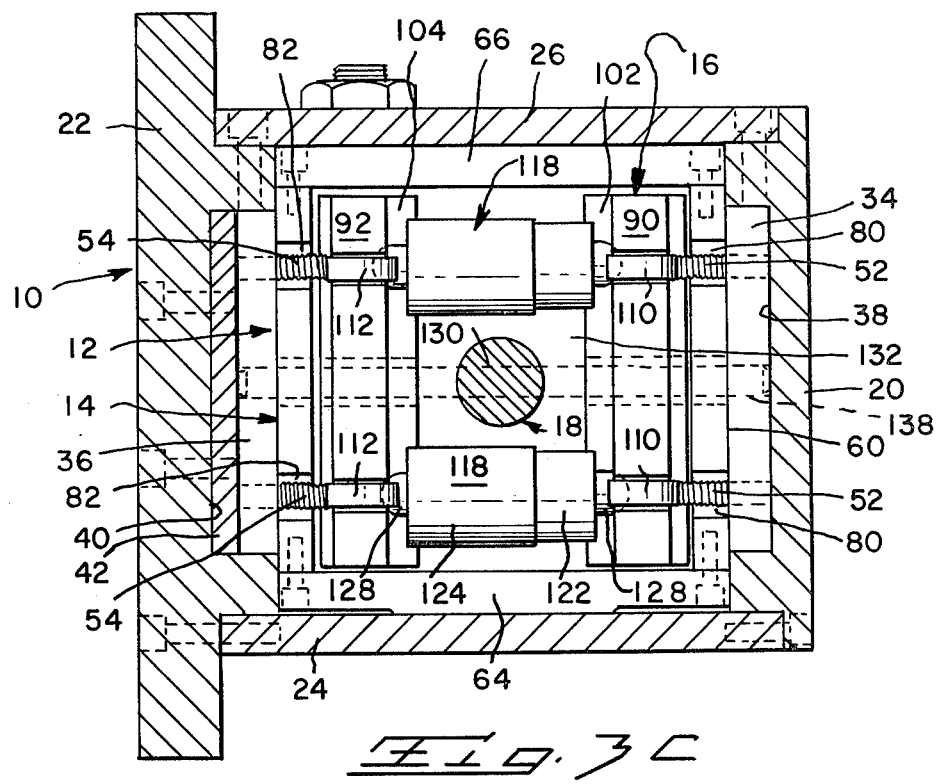
FIG. 3C is a horizontal section taken along line 3C—3C of FIG. 3.

The inter slide box 14 has a front plate 60, rear plate 62, and side plates 64, 66 (as best seen in FIG. 3C) forming a substantially rectangular inter slide box mounted for vertical movement within the cavity 32. The front and rear plates 60, 62 are respectively provided with centrally located, elongated pivot pin slots 68, 70, towards their lower ends and guide pin holes 72, 74 with guide pins 76, 78, respectively mounted therein towards their upper ends. The front and rear plates also include elongated guide pin notches 80, 82 at the upper edges thereof.

The gripping assembly 16 is mounted within the inner slide box 14 and includes a pivot pin block 84 secured to the side plates 64, 66, respectively, by pins 86, 88. The pivot arms 90, 92 are mounted on the block 84 by means of pins 94, 96, respectively. The upper portion of each pin arm includes an elongated and centrally disposed pivot pin slot 98, 100, a cam plate 102, 104, secured to the arm with a downwardly directed cam surface 106, 108. A cam wheel 110, 112 is rotatably mounted on the upper free end of each pivot arm 90, 92. Intermediate the cam plates 102, 104 and the cam wheels 108, 110 each arm has a notch 114, 116. Spring bias means 118, including a compression spring 120 and interfitting cylindrical housing members 122, 124, each with a knob 126, 128 on the respective ends thereof, is mounted between the arms with the knobs engaged in the respective notches 114, 116.

The drive means 18 includes a plunger rod 130 which is vertically driven in the housing by conventional means (not shown). A cam block 132 is fixed to the lower end of the plunger rod 130 and has a pair of upwardly directed cam surfaces 134, 136 in opposition to the cam surfaces 106, 108, respectively. A pivot pin 138 extends through the lower end of the plunger rod 130, the cam block 132, through the slots 98, 100 in the pivot arms 90, 92, the slots 68, 70 in the slide box plates 60 and 62, and has its ends engaged in the holes 44, 46 in the slide plates 34, 36.

A pair of jaws 140, 142 are connected to the lower end of the pivot arms 90, 92 respectively by adjustment assemblies 144, 146. A shuttle 148 is disposed between the jaws and is an elongated generally rectangular member having at least two alignment pins 150 extending from a first side. A spring pin 152 is mounted at each end of the first side. The pins 150 and 152 engage in respective apertures 154, 156 in a mandrel 158 of which only a blade portion is shown in FIGS. 1A and 1B. The mandrel 158 can be seen in phantom in FIG. 3B. The shuttle is also provided with a series of parallel, spaced transverse apertures 160 (FIG. 1B) each of which receives a respective tooth 162, 164 of FIG. 2B) of jaws 140, 142.

The strip of terminals is formed in the manner described in the previously mentioned patents and includes a terminal strip assembly 166 having a carrier tape 168 with a plurality of terminals 170, 172 carried thereby for insertion into apertures 174 and 176, respectively in housing 178. The terminals 170, 172 have been shown as pin terminals, however, it is to be understood that any type electrical terminal which can be applied to such a tape can be substituted.

The operation of the subject machine will now be described with relation to FIG. 1 through 5 which show the operational sequence of the machine, with FIGS. 1A through 5A showing the detail of the gripping of the terminals.

Figure 1A:
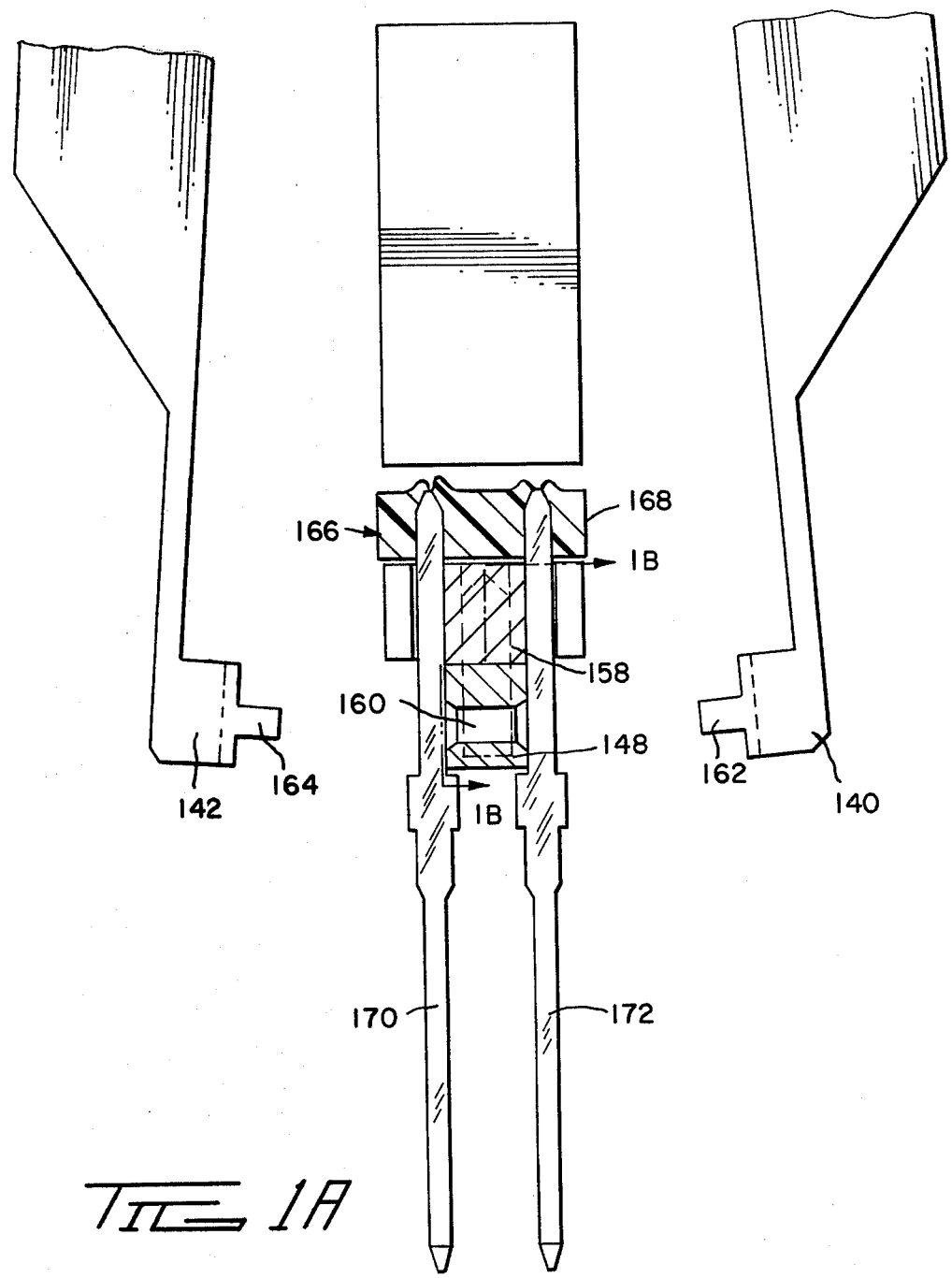
FIG. 1A is a detailed view, partially in section, of the jaw assembly portion of the subject machine in the condition of FIG. 1.

In FIG. 1 the slide plate case and inner slide box are in their upper most position. The plunger rod 130 is in its full upward position so that the cam surfaces 134, 136 of the cam block 132 engaged the respective cam surfaces 106, 108 of the cam plates 102, 104 to hold the pivot arms 90, 92 in the position shown, compressing the springs 120 of the spring bias means 118. The jaws 140, 142 are in a spread open position spaced from the respective sides of the shuttle 148 and the shuttle 148 is held in the mandrel 158 by engagement of the alignment pins 150 and springs 152 in the respective apertures 154, 156. A strip assembly 166 of terminals 168, 170 is fed in through the transition guide strip 180 in the bottom plate 30, and along the top of the mandrel 158 with the terminals 168, 170 depending downwardly on each side of the mandrel 158 and the shuttle 148. The strip assembly 166 is fed forwardly sufficiently to insure terminals will extend the entire length of the shuttle during the initial set up and subsequently the feed mechanism will move the strip forwardly a predetermined distance equal to the number of terminals to be inserted with each sequential operation.

Figure 2:
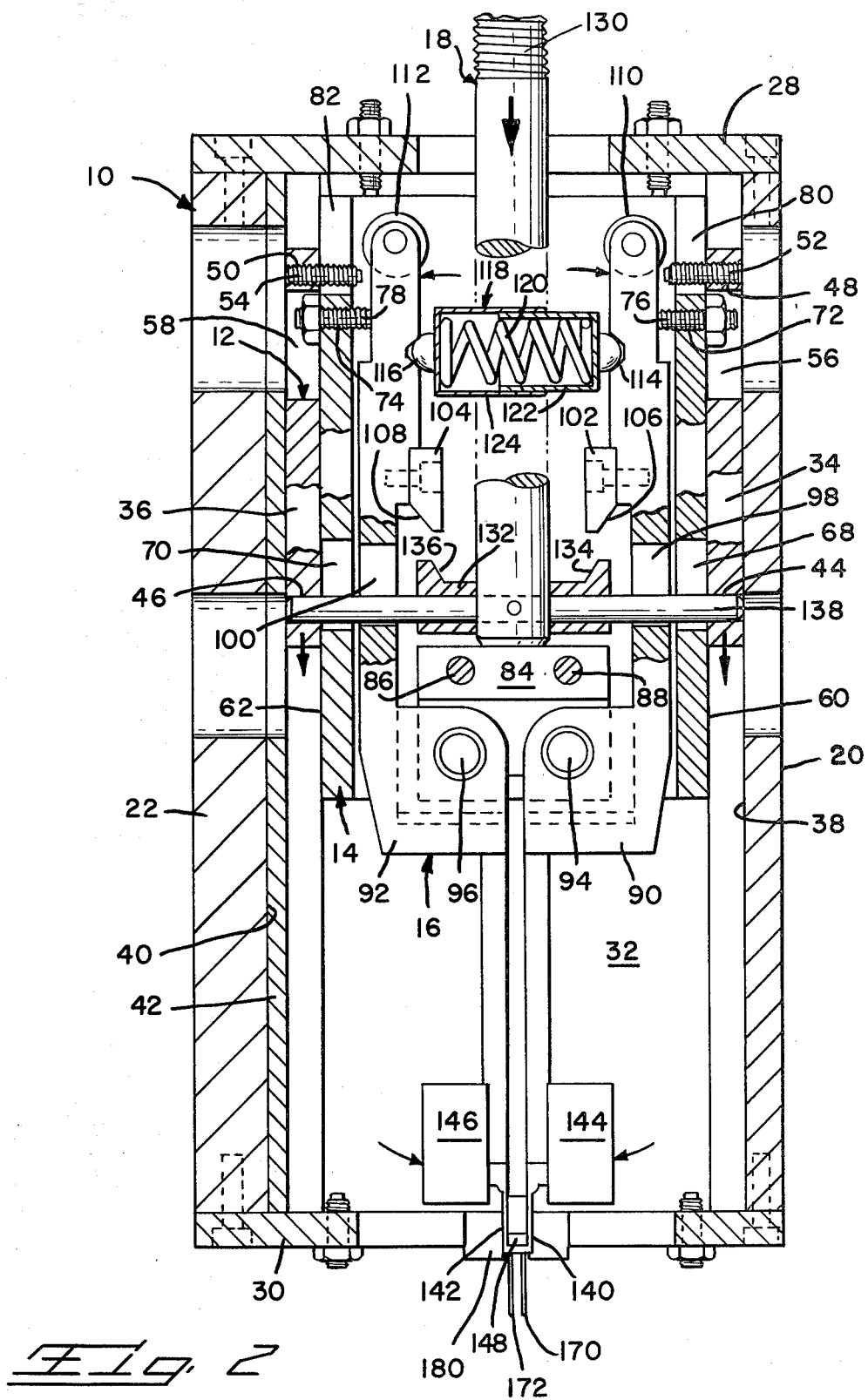
FIG. 2 is a vertical transverse section, similar to FIG. 1, showing the subject machine immediately after a group of terminals is grasped by the jaw assembly.
Figure 2A:
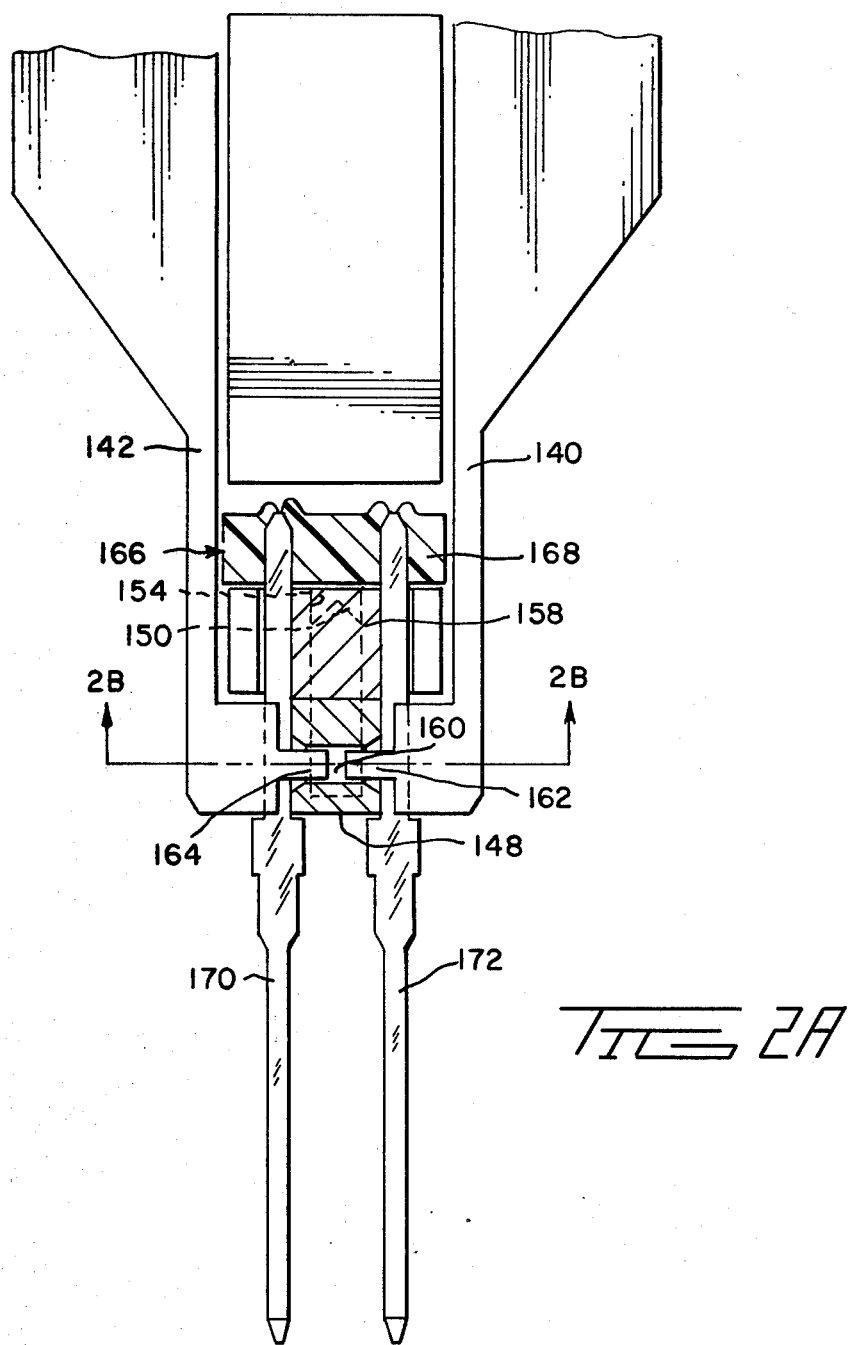
FIG. 2A is a detailed view, partially in section, of the jaw assembly in the position shown in FIG. 2.

The insertion sequence is started by initially driving the plunger rod 130 downwardly (FIG. 2) causing several things to happen substantially simultaneously. First the pivot pin 138 with its ends in holes 44, 46 of slide plates 34, 36 will cause these plates to move downwardly. The movement of the pin 138 is not immediately transmitted to the pivot pins 90, 92 nor the inner slide box 14 because of the elongated apertures 98, 100, 68, 70. The downward movement of the plunger rod 130 moves the cam block 132 downwardly to disengage the cam surfaces 134, 136 from surfaces 106, 108. Thus the upper end of the pivot arms will be released from the position shown in FIG. 1 and the spring assemblies 118 will drive the upper end of the pivot arms outwardly pivoting the arms around their respective pivot pins 94, 96. This rotating movement of the pivot arm brings the jaws 140, 142 into engagement with the terminals 170, 172 to drive them against the shuttle as shown in FIG. 2B. FIG. 2B shows how the terminals 170, 172 will be held in shaped recesses between teeth 162, 164 in the jaws 140, 142 and against side surfaces of the shuttle 148.

Figure 3:
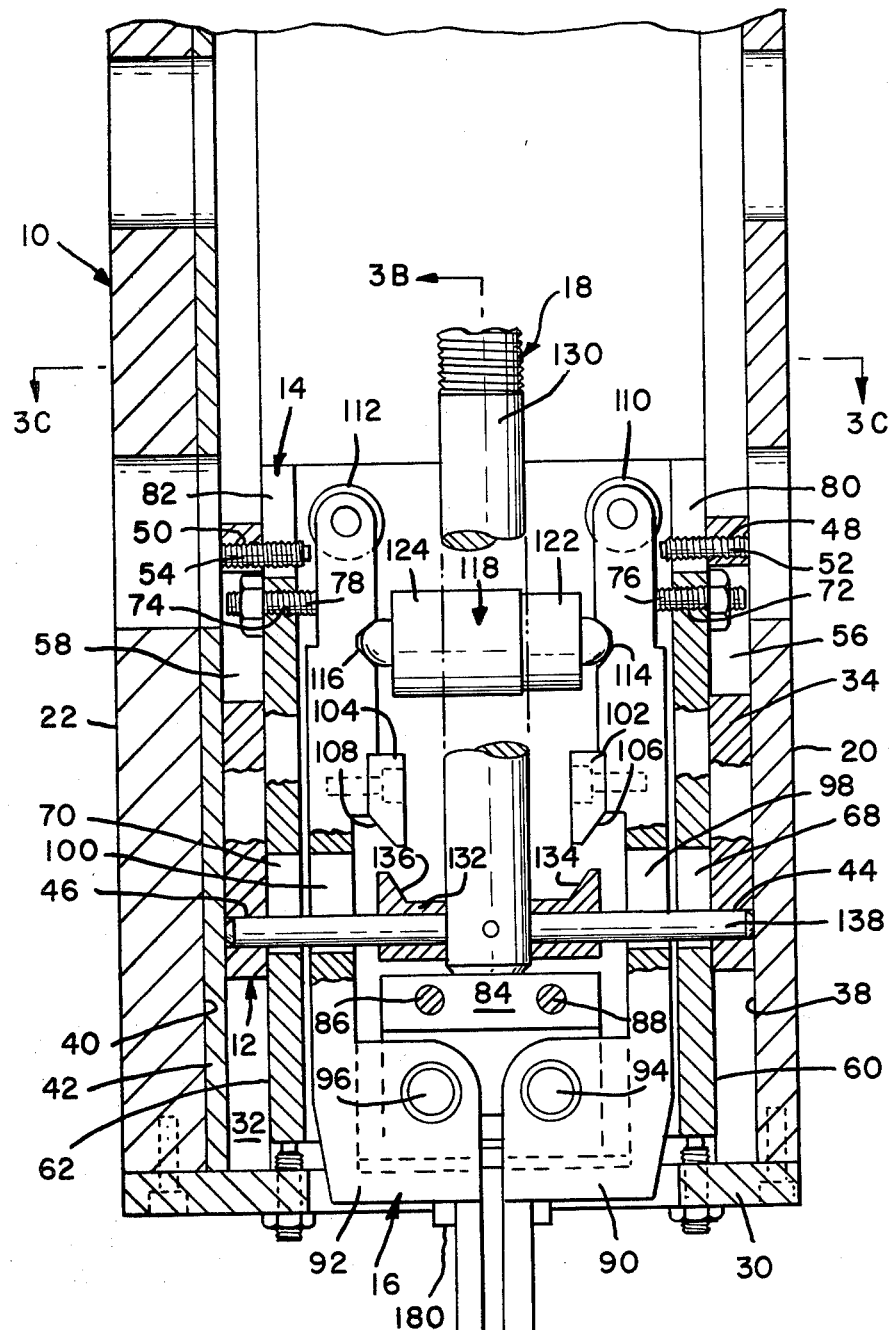
FIG. 3 is a vertical transverse section, similar to FIGS. 1 and 2, showing the subject machine in the fully extended and terminal inserted condition.
Figure 3A:
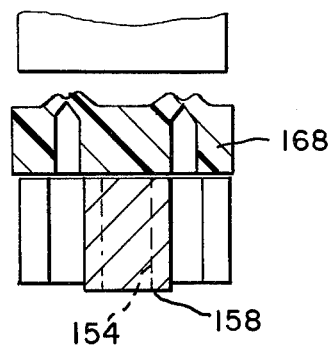
FIG. 3A is a detailed view, partially in section, of the jaw in the position shown in FIG. 3.
Figure 3A:
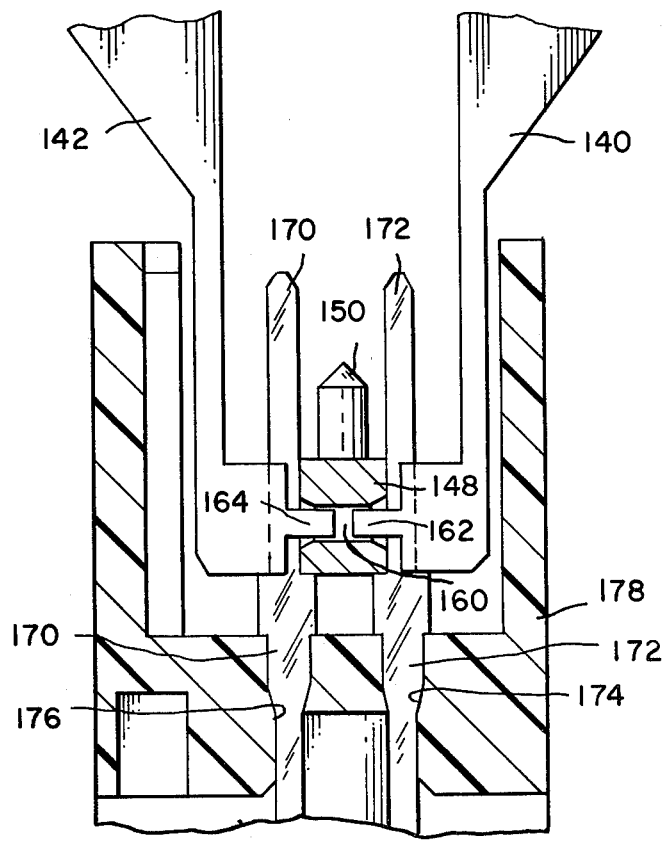

The continued downward driving motion of the plunger rod 130 brings the machine to the position shown in FIG. 3 wherein the terminals are fully inserted into the apertures 174, 176 of the housing 178. There is essentially no change in the relative position of the parts forming the slide plate case 12, the inner slide box 14, and the gripping assembly 16 between FIGS. 2 and 3. The continued downward movement of the plunger rod 130 causes the pivot pin 138 to engage the lower surfaces of the slots 98, 100, 68, 70 to drive the inner slide box 14 and gripping assembly 16 downwardly simultaneously with the downward movement of the slide plate case 12.

Figure 2C:
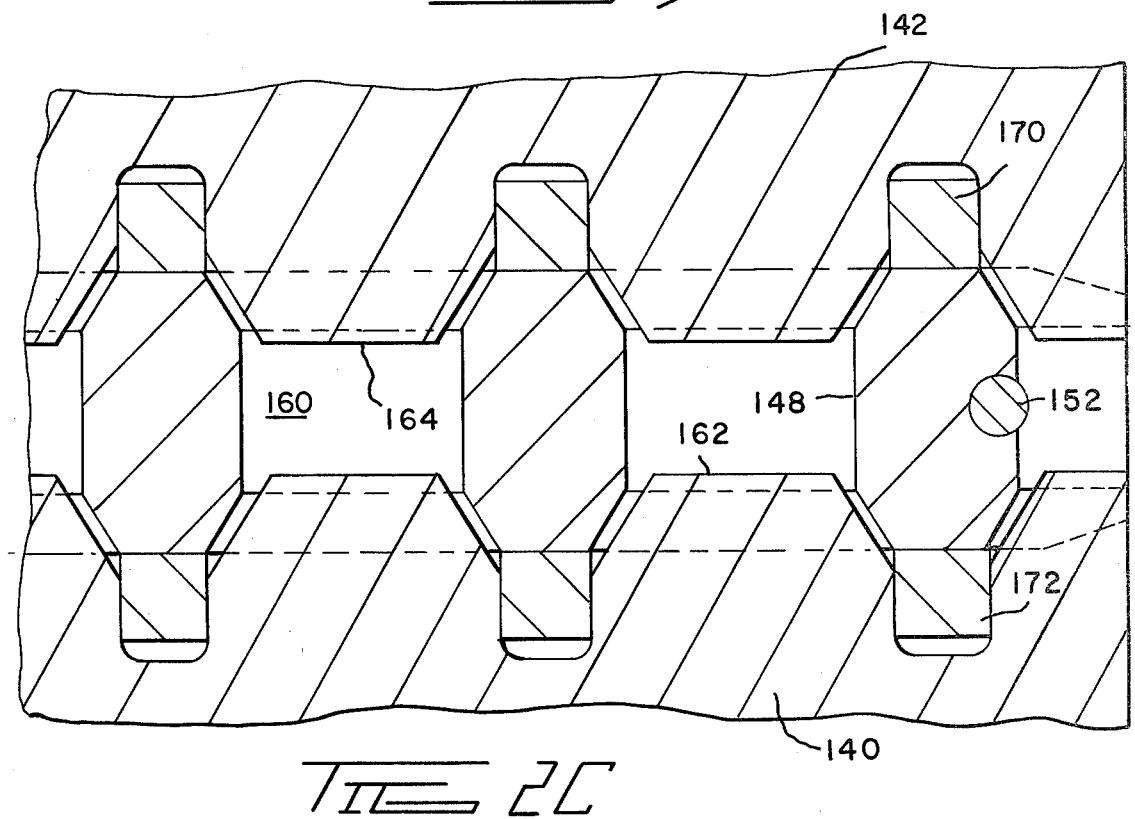
FIG. 2C is an enlarged detail of a fragment of the section of FIG. 2B.

FIG. 2C gives a greater detail picture of the configuration of the jaws and the shuttle showing in particular the configuration of the recesses in the jaws which allows for accommodating terminals of various dimensions and tolerances without requiring a change in the configuration in the jaws themselves.

Figure 4:
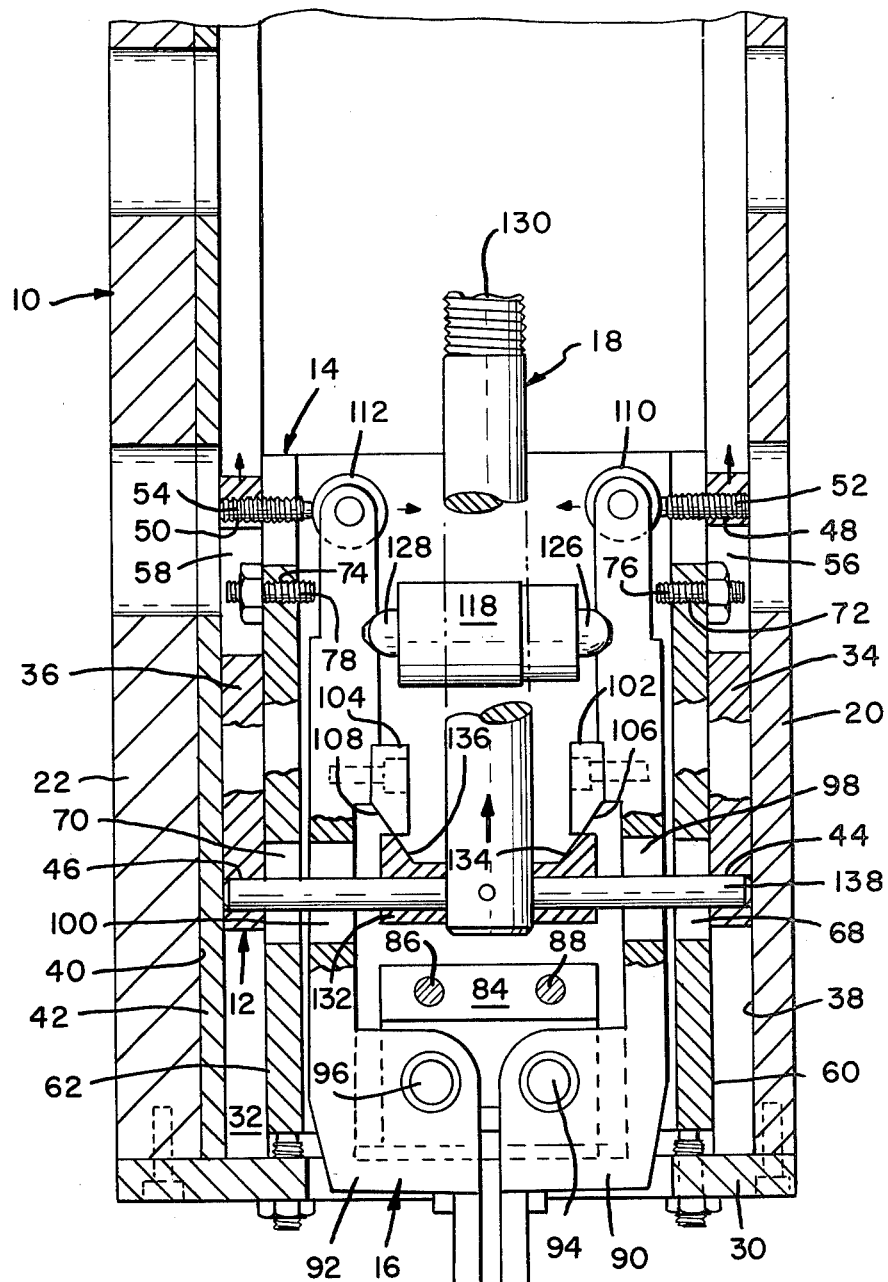
FIG. 4 is a vertical transverse section, similar to FIGS. 1, 2 and 3, showing the subject machine during the initial upward motion with tension released on the terminals but with the jaws still grasping the shuttle.
Figure 4A:
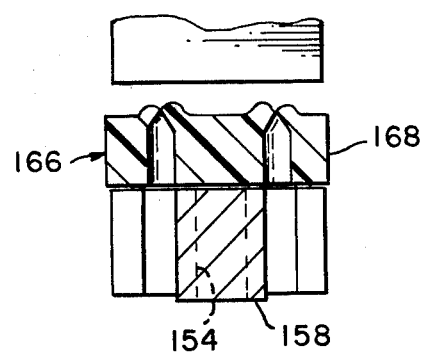
FIG. 4A is a detailed view, partially in section, of the jaw assembly in the position shown in FIG. 4.
Figure 4A:
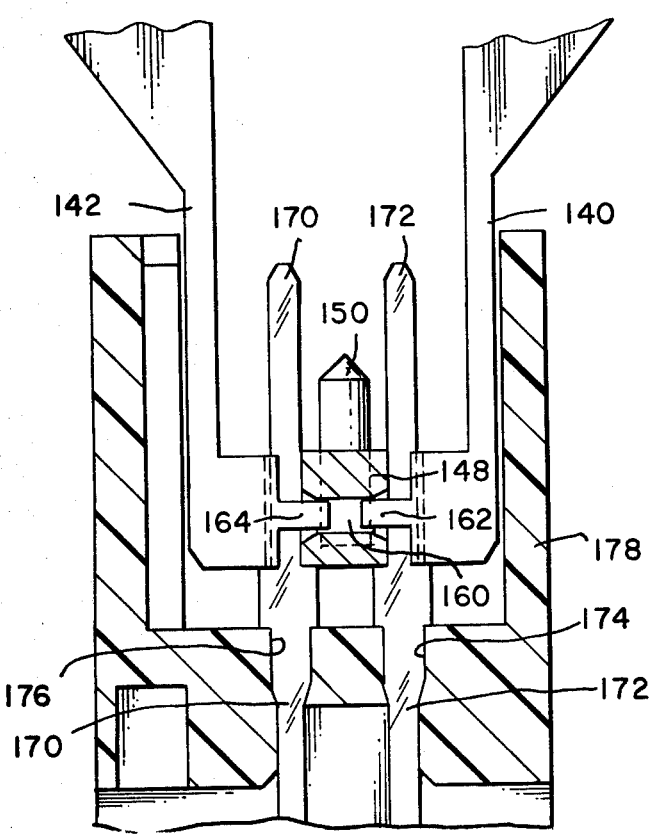
Figure 5:
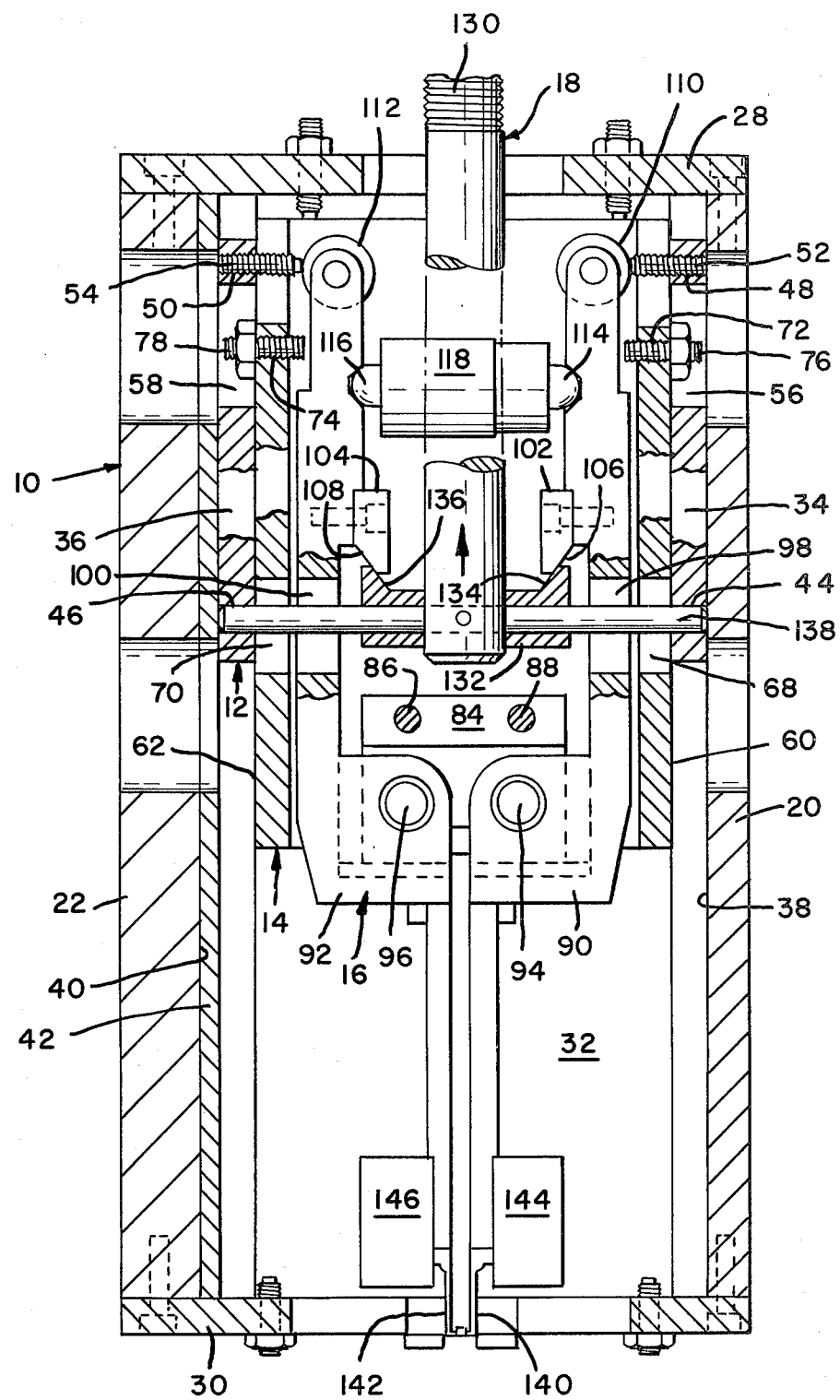
FIG. 5 is a vertical transverse section, similar to FIGS. 1, 2, 3 and 4, showing the subject machine in the condition of parking of the shuttle and immediately before returning to the position of FIG. 1.

The initial upward motion of the apparatus is shown in FIGS. 4 and 4A. The initial upward movement of the plunger rod 130 causes the slide plates 34, 36 to start in an upward direction bringing the cam block 132 into initial engagement with the cam plates 102, 104 so that surfaces 134, 136 initially engage surfaces 106, 108. This movement is accompanied by the guide pins 52, 54 engaging the respective cam rollers 110, 112 causing the inward rotation of the upper end of the pivot arms 90, 92 to slightly compress the spring means 118. This inward rotation of the upper end of the pivot arms 90, 92 causes an outward movement of the jaws 140, 142 for an initial release of the pressure on the inserted terminals while still maintaining a gripping hold on the shuttle 148.

The continued upward movement of the plunger rod 130 (FIG. 5) causes the slide plate case 12, the inner slide box 14, and the gripping assembly 16 to move upwardly without changing their relative positions until the shuttle 148 is again parked by the alignment pins 150 and springs 152 of the shuttle 148 engaging in the respective apertures 154, 156 of the mandrel 158. The further upward movement of the plunger rod 130 will cause the cam surfaces 134, 136 and 106, 108 to fully engage to cam the upper free ends of the pivot arms 90, 92 inwardly against the spring bias means 118 while simultaneously opening the jaws 140, 142 to assume the position shown in FIG. 1.

No means have been shown or described for placing the housing 178 in position at the insertion station. In fact the housings can be so placed by any known means, including both manual and mechanical placement, and can be indexed at the insertion station if desired. Thus, it is within the scope of the present invention to sequentially insert finite lengths of parallel rows of terminals into preformed apertures in a housing, printed circuit, or the like with subsequent like rows of terminals being inserted on either side or either end of the initially inserted terminals. This multiple insertion can be accomplished either by multiple insertion heads according to the present invention, indexing the terminal receptacle beneath a single insertion head, or any combination of insertion heads and indexing necessary to accomplish the desired ends.

The present invention may be subject to many modifications and changes without departing from the spirit or essential characteristics thereof. The present embodiment is therefore to be considered in all respects as illustrative and not restrictive of the scope of the invention.

What is claimed is:

1. An application machine for effecting mass insertion of electrical terminals into preformed apertures in housings, printed circuit boards, and the like in a closely spaced, high density array, the terminals each having one end adapted to form an interference fit in a respective preformed aperture and the other end detachably secured, to depend in two parallel spaced rows from a flexible carrier tape, said machine comprising:

a substantially closed housing defining a cavity therein;

a first assembly slidably mounted within said cavity;

a second assembly slidably mounted concentrically within said first assembly;

a shuttle assembly having a fixed mandrel with a detachable shuttle member positioned within said cavity to lie between said rows of terminals;

a gripping assembly mounted in said second assembly for gripping each said row of terminals against an adjacent side of said shuttle member and releasing said terminals after insertion;

drive means for imparting reciprocal motion to said first and second assemblies and movement to said gripping assembly;

whereby said tape carried terminals are fed between said gripping assembly and an adjacent side of said shuttle assembly and grasped therebetween, stripped from said tape, transported to and inserted into said preformed apertures, and released by said gripping assembly which returns said shuttle member to its original position.

2. An application machine according to claim 1 further comprising:

wear plates mounted in said housing, said first assembly sliding against said wear plates.

3. An application machine according to claim 1 further comprising:

drag means in said housing for applying drag force to said first assembly whereby the motion thereof is controlled.

4. An application machine according to claim 1 wherein said first assembly comprises:

a pair of parallel spaced plates;

said housing having walls defining channels in which said plates slide; and means directly driving said plates from said drive means.

5. An application machine according to claim 1 wherein said second assembly comprises:

an open ended box of plate members received within said first assembly and opening in the direction of movement;

means for pivotally mounting said gripping assembly within said box;

means connecting said second assembly to said drive means; and elongated slots in opposing ones of said plate members whereby driving movement from said drive means is imparted to said second assembly after a delay from the commencement of movement of said drive means.

6. An application machine according to claim 1 wherein said shuttle assembly comprises:

a mandrel fixed with respect to said housing in a position intermediate the rows of terminals; and a shuttle member detachably held to said mandrel to be removed therefrom and returned thereto by said gripping assembly.

7. An application machine according to claim 6 wherein said mandrel has an elongated arm with a plurality of apertures therein; and said shuttle member has at least one rigid alignment pin and at least one spring pin projecting from a surface thereof and positioned to engage in respective ones of said apertures in said mandral arm.

8. An application machine according to claim 1 wherein said gripping assembly comprises:
- a pair of elongated pivot arm members pivotally mounted intermediate their ends to said second assembly, each said pivot arm member having a profiled jaw member adjustably mounted on one free end, first cam means mounted on the opposite free end, and second cam means mounted between said intermediate pivotal mounting and said first cam means;
- spring bias means mounted between said pivot arm members intermediate said first and said second cam means;
- cam means secured to said drive means and for interacting with said second cam means to impart pivotal motion to said pivot arm members against the force of said spring bias means; and
- cam actuation means on both said first assembly and said second assembly for acting on said first cam means to control the movement of said pivot arms.

9. An application machine according to claim 8 wherein said shuttle assembly comprises:
- a mandrel fixed with respect to said housing in a position intermediate the rows of terminals; and
- a shuttle member detachably held to said mandrel, said shuttle member having a plurality of recesses along opposing longitudinal sides thereof;
- said jaw members having a toothed profile directed towards adjacent longitudinal sides of said shuttle member with each tooth thereof aligned to enter into a respective recess, whereby said jaws engage said shuttle member to remove it from and return it to said mandrel.

10. An application machine according to claim 8 wherein each said jaw member has a profile formed by a plurality of parallel spaced teeth defining recesses therebetween,
- each said recess having smooth surfaces of transition whereby terminals within a range of tolerances are accommodated.

11. An application machine according to claim 1 wherein said drive means comprises:
- a plunger rod mounted for reciprocal movement in said housing;
- pin means fixedly attaching said plunger rod to and directly driving said first assembly;
- said second assembly having at least one elongated slot through which said pin means passes so that driving motion is transmitted to the second assembly a delayed period after the initial movement of said plunger rod; and
- means fixedly attached to said plunger rod for imparting pivotal movement to said gripping assembly whereby said terminals are gripped upon initial movement of said plunger rod in a first direction and released upon initial movement of said plunger rod in a second direction.

12. A method of gang loading terminals into preformed apertures in a printed circuit board, housing, and the like, comprising the steps of:
- providing a plurality of terminals in two parallel, spaced, continuous rows with each terminal having one end engaged in a flexible carrier strip;
- gripping said terminals against opposite sides of a centrally disposed shuttle by jaws having inwardly directed toothed surfaces serving to align said terminals against said shuttle;
- removing said terminals from said carrier strip and transporting them to a position for simultaneous introduction into respective preformed apertures;
- driving said terminals into said apertures with sufficient force to seat the terminals therein;
- initially relaxing the gripping of said jaws sufficiently to release said terminals while maintaining hold of said shuttle; and
- removing said shuttle from between the seated terminals and returning it to a centrally disposed position adapted to receive the next sequential series of terminals.

* * * * *